United States Patent
Mimken et al.

(10) Patent No.: US 7,775,219 B2
(45) Date of Patent: Aug. 17, 2010

(54) PROCESS CHAMBER LID AND CONTROLLED EXHAUST

(75) Inventors: Victor B. Mimken, Boise, ID (US); Scott Meyer, Boise, ID (US); Douglas Richards, Meridian, ID (US); Evanson G. Baiya, Nampa, ID (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 11/617,891

(22) Filed: Dec. 29, 2006

(65) Prior Publication Data

US 2008/0156348 A1  Jul. 3, 2008

(51) Int. Cl.
*B08B 3/10* (2006.01)
(52) U.S. Cl. .................. 134/94.1; 134/95.2; 134/902
(58) Field of Classification Search ............ 134/2, 134/902
See application file for complete search history.

(56) References Cited

U.S. PATENT DOCUMENTS

| | | | |
|---|---|---|---|
| 4,672,624 A * | 6/1987 | Ford | 372/87 |
| 5,017,236 A | 5/1991 | Moxness et al. | |
| 5,090,432 A | 2/1992 | Bran | |
| 5,091,207 A * | 2/1992 | Tanaka | 427/8 |
| 5,464,480 A | 11/1995 | Matthews | |
| 5,556,479 A | 9/1996 | Bran | |
| 5,601,655 A | 2/1997 | Bok et al. | |
| 5,896,875 A | 4/1999 | Yoneda | |
| 6,006,765 A | 12/1999 | Skrovan et al. | |
| 6,131,588 A * | 10/2000 | Kamikawa et al. | 134/102.3 |
| 6,134,942 A * | 10/2000 | Pasquereau et al. | 73/23.31 |
| 6,192,600 B1 | 2/2001 | Bergman | |
| 6,240,938 B1 | 6/2001 | Oshinowo | |
| 6,273,100 B1 | 8/2001 | Andreas et al. | |
| 6,276,370 B1 | 8/2001 | Fisch et al. | |
| 6,311,702 B1 | 11/2001 | Fishkin | |
| 6,328,814 B1 | 12/2001 | Fishkin et al. | |
| 6,453,992 B1 * | 9/2002 | Kim | 165/206 |
| 6,510,859 B1 * | 1/2003 | Kamikawa | 134/61 |
| 6,632,751 B2 | 10/2003 | Mertens et al. | |
| 6,695,926 B1 | 2/2004 | Koyanagi et al. | |
| 2002/0195128 A1 | 12/2002 | Shibagaki | |
| 2003/0205559 A1 * | 11/2003 | Hansen et al. | 216/108 |
| 2004/0050408 A1 * | 3/2004 | Christenson et al. | 134/184 |

(Continued)

FOREIGN PATENT DOCUMENTS

EP  1 168 422  1/2002

(Continued)

*Primary Examiner*—Michael Kornakov
*Assistant Examiner*—Ryan Coleman
(74) *Attorney, Agent, or Firm*—Patterson & Sheridan, LLP

(57) ABSTRACT

A method and apparatus for efficiently exhausting harmful vapors and fumes from a substrate processing chamber is described. The processing chamber includes a lower volume configured as a liquid atmosphere, and an upper volume configured as a gaseous atmosphere to at least partially contain vapors or fumes above the liquid. The apparatus includes a lid member configured to seal the processing chamber and a lid assembly adapted to provide processing liquids while exhausting the vapors or fumes from the processing chamber. Switchable valves and/or a variable source of negative pressure may be coupled to the lid assembly to provide a controlled exhaust. A method of preventing or minimizing the escape of fumes or vapors is also described.

9 Claims, 4 Drawing Sheets

U.S. PATENT DOCUMENTS

| | | |
|---|---|---|
| 2004/0108064 A1* | 6/2004 | Brown .................. 156/345.12 |
| 2006/0201363 A1 | 9/2006 | Nakatsukasa et al. |
| 2008/0035055 A1* | 2/2008 | Dip et al. .................... 118/715 |

FOREIGN PATENT DOCUMENTS

| | | |
|---|---|---|
| JP | 2000-21840 | 8/1999 |
| JP | 2001223195 | 8/2001 |
| JP | 2001271188 | 10/2001 |
| JP | 2001286831 | 10/2001 |
| JP | 2002162113 | 6/2002 |
| JP | 2002172367 | 6/2002 |
| JP | 2002176019 | 6/2002 |
| JP | 2004319724 | 11/2004 |
| JP | 2005051099 | 2/2005 |
| JP | 2005051101 | 2/2005 |
| JP | 2005064252 | 3/2005 |
| JP | 2005064482 | 3/2005 |
| JP | 2005166847 | 6/2005 |
| JP | 2005166848 | 6/2005 |
| JP | 2005166956 | 6/2005 |
| JP | 2005166957 | 6/2005 |
| JP | 2005166958 | 6/2005 |
| JP | 2005244130 | 9/2005 |
| JP | 2006344912 | 2/2006 |
| JP | 2006080420 | 3/2006 |
| JP | 2006093334 | 4/2006 |
| JP | 2006108512 | 6/2006 |
| JP | 2006294762 | 10/2006 |
| JP | 2007042691 | 2/2007 |
| JP | 2007059832 | 3/2007 |
| JP | 2007077410 | 3/2007 |
| JP | 2007105626 | 4/2007 |
| WO | 00/21692 | 4/2000 |

* cited by examiner

PROCESS CHAMBER LID AND CONTROLLED EXHAUST

BACKGROUND OF THE INVENTION

1. Field of the Invention

This application relates to cleaning a substrate, such as a semiconductor wafer. More specifically, this application provides methods and apparatus for processing a substrate in a cleaning and/or surface preparation process.

2. Description of the Related Art

Substrate surface preparation and cleaning is an essential step in the semiconductor manufacturing process. Multiple cleaning steps can be performed on one or a plurality of substrates. The process recipe may include etch, clean, rinse, and dry steps, which, in combination, and may be referred to generally as a substrate surface cleaning/surface preparation process. The substrate or substrates are exposed to a variety of process and rinse chemicals in chambers configured for a single substrate or more than one substrate, or multiple chambers configured for a single substrate or more than one substrate. Process chemicals include etchants, for example acids such as hydrofluoric acid (HF), hydrochloric acid (HCl), among others, rinsing agents, such as de-ionized (DI) water, and cleaning agents, such as standard clean 1 (SC1) and/or an ammonia/peroxide mixture (APM). Each cleaning chamber may have piezoelectric transducers to propagate megasonic energy into the chamber's cleaning solution, which enhances cleaning by inducing microcavitation in the cleaning solution helping to dislodge particles off of the substrate surface. Drying of the substrate or substrates is also performed and may be facilitated by using a rinse/drying solution, such as isopropyl alcohol (IPA) among other fluids.

The chemicals typically used in common semiconductor surface cleaning/surface preparation processes require strict safety and disposal standards due to the harmful nature of some of the chemicals. Each chemical has a threshold limit value (TLV®) that reflects the level of exposure that the typical worker can experience without an unreasonable risk of disease or injury when he/she interacts with the vapors emitted during the cleaning process. Also, in some cleaning processes, flammable materials are used. To facilitate safe operation, the cleaning chamber or chambers are typically isolated from the clean room environment by the use of a containment vessel or cabinet. To prevent safety hazards, such as fire or explosions or chemical exposure, one may need to exhaust the emitted vapors to assure that concentration of vapors in the containment vessel is low enough, for example, below the lower explosion limit (LEL). To facilitate removal of the vapors, the containment vessel may be coupled to a source of negative pressure to remove harmful vapors so that the vapors in the containment vessel will not cause a safety hazard, such as a fire or explosion or exposure to personnel.

Due to various hardware and processing constraints the containment vessel or cabinet is typically much larger than the cleaning vessel. Additionally, in some conventional systems, each cleaning chamber may be coupled to a source of negative pressure to facilitate removal of vapors emitted by that chamber. The large vessel may also include a volume that requires a high volume exhaust source in order to efficiently and/or sufficiently remove the vapors and fumes. However, some vapors may escape the cleaning chamber and fill the containment vessel, which may create the safety hazards mentioned above. Further, if the vapors or fumes are not removed sufficiently, the large containment vessel can create a safety hazard by pockets or areas of high vapor concentration. Therefore, there is need to assure that a worker's exposure to the harmful vapors when he/she interacts with the cleaning chamber or containment vessel is below the TLV® for that particular chemical, and to minimize accumulation of volatile vapors exterior to the cleaning chamber.

What is needed is an apparatus and method of containing substantially all vapors from an individual chamber within the processing system in order to minimize or eliminate the safety concerns mentioned above.

SUMMARY OF THE INVENTION

The present invention generally provides a method and apparatus for removing vapors or fumes before, during, and after a substrate surface cleaning/substrate surface preparation process. The apparatus includes a lid member configured to seal the processing chamber and a lid assembly adapted to provide processing liquids while exhausting the vapors or fumes from the processing chamber. Switchable valves may be coupled to the lid assembly and a variable actuation of negative pressure provided to the chamber provides a controlled exhaust. A method of preventing or minimizing the escape of fumes or vapors is also described.

In one embodiment, a substrate processing apparatus is described. The apparatus includes a chamber having an interior volume sized to receive a single substrate, wherein the interior volume further comprises a lower volume configured to maintain a liquid at a predetermined depth, and an upper volume configured to at least partially confine a gaseous atmosphere above the liquid, a transducer assembly disposed in the lower volume, a plurality of transducer assemblies disposed near an interface between the upper and lower volume, and an exhaust system coupled to the chamber configured to remove vapors from the interior volume.

In another embodiment, a lid assembly for a substrate processing system is described. The lid assembly includes a chamber having an interior volume sized to receive a single substrate, wherein the interior volume further comprises a lower volume configured to maintain a liquid at a predetermined depth, and an upper volume configured to at least partially confine a gaseous atmosphere above the liquid, a lid member disposed on an upper portion of the chamber, the lid member comprising a body having an upper surface and an underside and an opening formed between the upper surface and the underside, the opening sized to receive a single substrate, and a plurality of inlet channels and a plurality of exhaust channels formed in the body and disposed outward of and adjacent to the opening, wherein each of the plurality of inlet channels and the plurality of exhaust channels include one or more apertures formed in the underside and in fluid communication with the inlet channels and the exhaust channels.

In another embodiment, a method of exhausting a semiconductor processing chamber is described. The method includes providing a chamber having an interior volume comprising a lower volume, an upper volume, and an opening sized to receive at least one substrate, transferring the substrate through the upper volume and the opening to the lower volume, sealing the opening with a lid member coupled to the substrate transfer assembly, cleaning the substrate while providing a negative pressure to the upper volume, and transferring the substrate out of the lower volume while providing a vapor at a liquid/vapor interface disposed between the upper volume and the lower volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
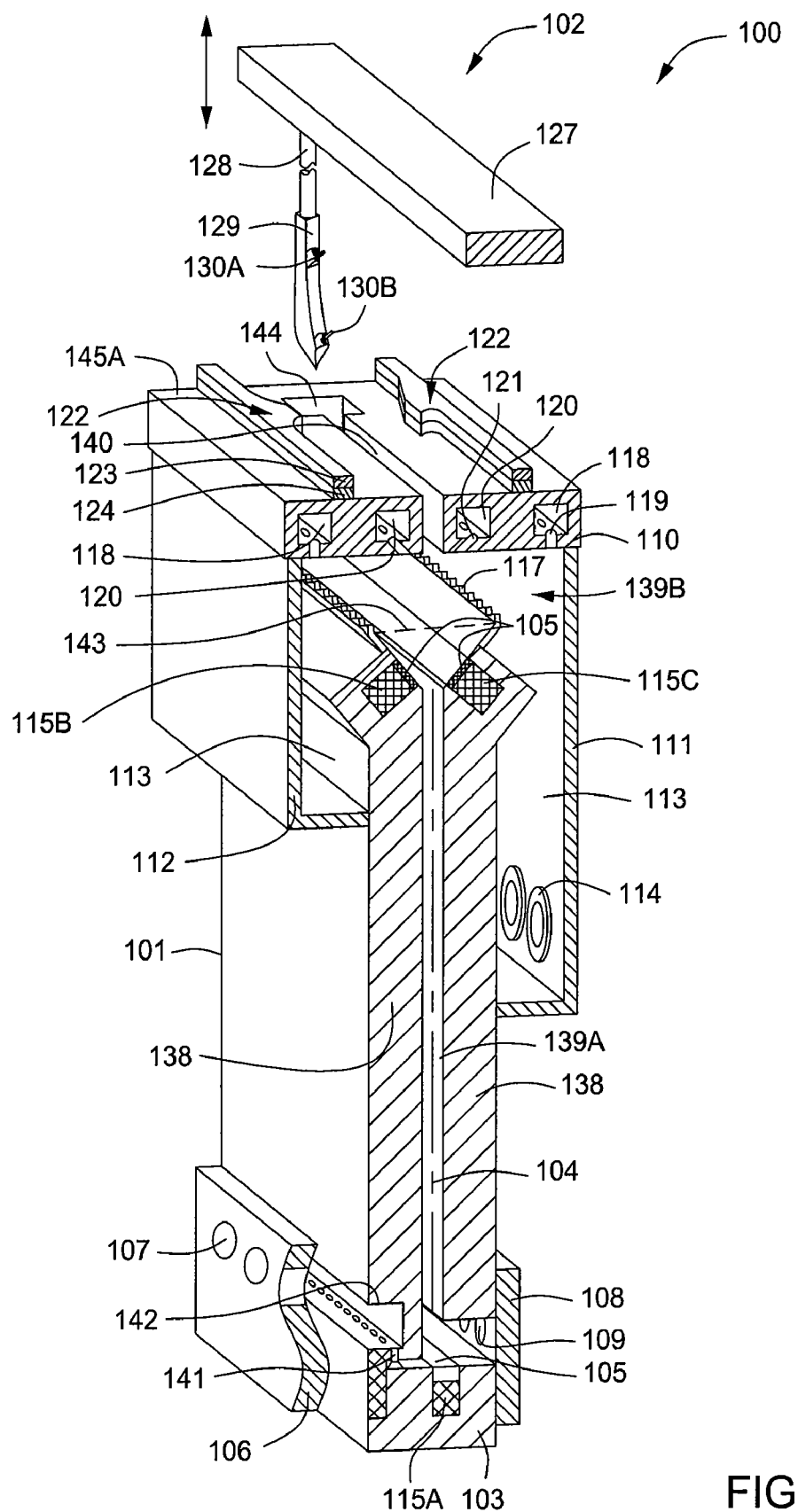
FIG. 1 is an isometric cross sectional view of one embodiment of a substrate processing chamber.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

The present invention relates to embodiments of chambers for processing a single substrate and associated processes with embodiments of the chambers. The chambers and methods of the present invention may be configured to perform substrate surface cleaning/surface preparation processes, such as etching, cleaning, rinsing and /or drying a single substrate. Etching process chemicals may include selective etchants and non-selective ethants (NSE), buffered etchants (LAL as one example), a buffered oxide etchant (BOE), among others. Cleaning chemicals may include standard clean 1 (SC1), standard clean 2 (SC2), RCA, an ammonia/peroxide mixture (APM), AM1 chemistry (available from Applied Materials, Inc., of Santa Clara, Calif.), among other cleaning solutions and chemicals.

Although the illustrative chambers are described for use with one substrate, the embodiments described herein may be used for cleaning a plurality of substrates in a single chamber. Similar processing chambers may be found in U.S. Pat. No. 6,726,848, which issued on Apr. 27, 2004, U.S. patent application Ser. No. 11/460,049, filed Jul. 26, 2006, and U.S. patent application Ser. No. 11/445,707, filed Jun. 2, 2006, all of which are incorporated herein by reference. Embodiments of the invention may be adapted to be disposed on a substrate surface cleaning/surface preparation tool available from Applied Materials, Inc., of Santa Clara, Calif., sold under the trade name "Emersion."

FIG. 1 illustrates an isometric cross sectional view of one embodiment of a substrate processing chamber 100. The substrate processing chamber 100 comprises a chamber body 101 configured to retain a fluid, and a substrate transfer assembly 102 configured to transfer a substrate (not shown) into and out of the chamber body 101. The chamber body 101 generally includes an interior volume, indicated generally as a lower chamber volume 139A and an upper chamber volume 139B, collectively configured as a liquid and/or a vapor processing environment. More specifically, the lower chamber volume 139A is configured as a liquid processing environment to maintain a liquid at a predetermined depth within the body, and may also be referred to as liquid atmosphere to facilitate wet processes. The upper chamber volume 139B is configured as a vapor processing environment to maintain or at least partially contain vapors or fumes to facilitate drying processes, and may also be referred to as a gaseous atmosphere to at least partially confine a gas, vapors, or fumes above the liquid to facilitate drying processes.

The lower portion of the chamber body 101 generally comprises side walls 138 and a bottom wall 103 defining the lower chamber volume 139A. The lower chamber volume 139A may have a rectangular shape configured and sized to retain fluid for immersing a substrate therein. The upper chamber volume 139B generally comprises a chamber lid 110 having an opening 140 formed therein, and an area below the lid 110 and above the lower chamber volume 139A. The opening 140 is configured to allow the substrate transfer assembly 102 to transfer at least one substrate in and out the chamber body 101. A weir 117 is formed on top of the side walls 138 to contain and allow fluid from the lower chamber volume 139A to overflow. The upper portion of the chamber body 101 includes overflow members 111 and 112 configured to collect fluid flowing over the weir 117 from the lower chamber volume 139A. Each of the overflow members 111, 112 may be coupled together by a conduit (not shown), such as by a hose between overflow member 112 to overflow member 111, that is configured to allow fluid to drain from overflow member 112 to overflow member 111. The coupling of the overflow members 111, 112 allows all fluid to be collected at a common location, which in this embodiment is the lower portion of overflow member 111.

An inlet manifold 142 is formed on the sidewall 138 near the bottom of the lower portion of the chamber body 101 and is configured to fill the lower chamber volume 139A with processing fluid. The inlet manifold 142 has a plurality of apertures 141 opening to the bottom of the lower chamber volume 139A. An inlet assembly 106 having a plurality of inlet ports 107 is connected to the inlet manifold 142. Each of the plurality of inlet ports 107 may be connected with an independent fluid source (not shown) by a dedicated valve (not shown), such as sources for etching, cleaning, and de-ionized (DI) water for rinsing, such that different fluids, or a combination of fluids, may be supplied to the lower chamber volume 139A for different processes.

During processing, fluid may flow in from one or more of the inlet ports 107 to fill the lower chamber volume 139A from the bottom via the plurality of apertures 141. Flow rates for DI water may be stagnant to about 70 liters per minute (lpm), such as between about 1 lpm and about 60 lpm, for example, between about 35 lpm to about 55 lpm for a high flow rate, and about 1 lpm to about 10 lpm for a low flow rate. Standard clean 1 (SC1), an ammonia/peroxide mixture (APM), or AM1 may be supplied to the lower chamber volume 139A at less than about 1 lpm to about 35 lpm, such as a rate between about 15 lpm to about 25 lpm. An etchant, such as hydrofluoric acid (HF), a selective etchant, a non-selective etchant, a buffered etchant, among others, may be supplied to the lower chamber volume 139A at a flow rate of less than 0.5 lpm to about 35 lpm, such as a flow rate of about 15 lpm to about 25 lpm.

As the processing fluid fills up the lower chamber volume 139A and reaches the weir 117, the processing fluid overflows from the weir 117 to an overflow volume 113 formed at least partially by the overflow members 111 and 112. Fluid from overflow member 112 may be flowed to the overflow member 111 to a common collection point in the lower portion of overflow member 111. A plurality of outlet ports 114, configured to drain the collected fluid, may be formed on the overflow member 111. The plurality of outlet ports 114 may be connected to a pump system, and in one embodiment, each of the plurality of outlet ports 114 may form an independent drain path dedicated to a particular processing fluid. In one embodiment, each drain path may be routed to a negatively pressurized container to facilitate rapid removal, draining, and/or recycling of the processing fluid.

In one embodiment, the lower chamber volume 139A may include a volume between about 1500 milliliters (mL) to about 1750 mL, for example, between about 1600 mL to about 1700 mL. In one embodiment, the lower chamber volume 139A may be filled in less than about 10 seconds, for example less than about 5 seconds, such as between about 5 seconds and about 1 second.

In one embodiment, the upper chamber volume 139B, which may include the overflow volume 113, includes a volume of about 6000 mL to about 8000 mL, although the volume of the upper chamber volume and the overflow volume 113 may be larger or smaller, depending on design parameters. In any case, the upper chamber volume 139B and overflow volume 113 is preferably proportioned to enable exhausting of the volume contained therein. Preferably, the volume of the upper chamber volume 139B and overflow volume 113 is matched to a suitable exhaust system as described herein that is configured to exhaust the desired volume, in order to prevent or minimize build-up of vapors or fumes.

A drain assembly 108 may be coupled to the sidewall 138 near the bottom of the lower chamber volume 139A that is in fluid communication with the lower chamber volume 139A. The drain assembly 108 is configured to drain the lower processing volume 139A rapidly. In one embodiment, the drain assembly 108 has a plurality of drain ports 109, each configured to form an independent drain path dedicated to a particular processing fluid. In one embodiment, each of the independent drain paths may be connected to a negatively pressurized sealed container for fast draining of the processing fluid in the lower processing volume 139. Examples of fluid supply and drain configurations may be found in FIGS. 9-10 of U.S. patent application Ser. No. 11/445,707, filed Jun. 2, 2006, which was previously incorporated by reference.

In one embodiment, a transducer assembly 115A is disposed behind or integral to a window 105 in the bottom wall 103. The transducer assembly 115A may be one or more megasonic transducers configured to provide megasonic energy to the lower processing volume 139A. The transducer assembly 115A may include a single transducer or an array of transducers, oriented to direct megasonic energy into the lower chamber volume 139A via the window 105. In another embodiment, a pair of transducer assemblies 115B, 115C, each of which may include a single transducer or an array of multiple transducers, are positioned behind or integral to windows 105 at an elevation below that of the weir 117, and are oriented to direct megasonic energy into an upper portion of lower chamber volume 139A.

The transducer assemblies 115B and 115C are configured to direct megasonic energy towards a front surface and a back surface of a substrate as the substrate is positioned in the lower chamber volume 139A, and may be actuated as the substrate passes through a liquid/vapor interface, generally indicated by a dashed line at 143, which may include a level within about the upper 0-20% of the liquid in the lower chamber volume 139A. The windows 116 may be made of a process resistant material, such as sapphire, quartz, and the like, and are coupled to the chamber 100 to facilitate ease of replacement.

When the transducer assembly 115A directs megasonic energy into processing fluid in the lower chamber volume 139A, acoustic streaming, i.e. streams of micro bubbles, within the processing fluid may be induced. The acoustic streaming aids the removal of contaminants from the substrate being processed and keeps the removed particles in motion within the processing fluid to avoid or minimize reattachment of the removed particles to the substrate surface. The transducer assemblies 115B, 115C are positioned such that the induced energy interacts with the substrate surface at, or just below, the liquid/vapor interface 143. The transducer assemblies 115B, 115C may be configured to direct megasonic energy in a direction normal to the substrate surface, or at an angle from normal. In one embodiment, energy is directed at an angle of approximately 0-30 degrees from normal, such as approximately 5-30 degrees from normal. Power may be provided to each transducer assembly 115A, 115B, 115C in a range of about 0 watts to about 60 watts.

In one embodiment, the angle of the transducer assemblies 115B, 115C are independently adjustable, and the power to the transducer assemblies 115A, 115B, and 115C may be varied independently. The rotational alignment of the substrate prior to entry into the substrate processing chamber 100 may also be selected to reduce damage to features on the device. The flow of fluid through the lower chamber volume 139A during megasonic cleaning applies a force on the features, and the applied force may be substantially reduced by orienting the substrate in a direction most resistant to the applied force. Examples of transducer assemblies, power adjustment to transducer assemblies, angle adjustments to transducer assemblies, and substrate orientations may be found in U.S. patent application Ser. No. 11/460,054, filed Jul. 26, 2006, and U.S. patent application Ser. No. 11/460,172, filed Jul. 26, 2006, which are both incorporated by reference herein.

As shown in FIG. 1, the opening 140, which is configured to allow the substrate transfer assembly 102 in and out the chamber body 101, is formed near a center portion of the chamber lid 110. In one embodiment, the chamber lid 110 includes one or more inlet channels 120 and one or more exhaust channels 118, which may be formed on each side of the opening 140. In this embodiment, the inlet channels 120 are formed on opposing sides of the opening 140 and the exhaust channels 118 are formed on each side of the opening in a position outward of the inlet channels 120.

Each of the channels 118, 120 include one or more apertures formed therein that facilitate fluid communication between the channels 118, 120 and the upper chamber volume 139B. The one or more apertures are depicted in FIG. 1 as a plurality of openings 119 and 121, but may alternatively be configured as a single opening, such as a channel, or multiple channels or slots, which are formed between the channels 118, 120 and in communication with the upper chamber volume 139B. In one embodiment, each of the channels 118, 119 include a plurality of openings 119, 121 and the plurality of openings 121 provide a fluid from the channel 120 to the upper chamber volume 139B, and the plurality of openings 119 remove fluids from the upper chamber volume 139B to the channel 118. The fluids to be removed from the upper chamber volume 139B, or the fluids provided to the upper chamber volume 139B, may be gaseous, such as fumes or vapors. In one embodiment, gases such as isopropyl alcohol (IPA) vapor, helium (He), argon (Ar), nitrogen ($N_2$), hydrogen ($H_2$), chlorofluorocarbons, for example, a Freon® compound, ozone ($O_3$), and the like, may be provided to the upper chamber volume 139B or removed from the upper chamber volume 139B.

One or both of the plurality of openings 119, 121 may be configured to facilitate enhanced flow of the fluids passing therethrough. For example, the number, size, and pitch of the plurality of openings 119, 121 may be varied to enhance or restrict flow of fluids passing therethrough. The plurality of openings 119, 121 may be configured as nozzles, and may be angled from a longitudinal axis 104 of the chamber 100, for example, at about 15 degrees to about 45 degrees from the longitudinal axis 104. In one embodiment, the plurality of openings 119 are substantially parallel to the longitudinal axis 104 and the plurality of openings 121 are angled at about 20 degrees to about 30 degrees from the longitudinal axis, such as about 25 degrees from the longitudinal axis 104. In another embodiment, the plurality of openings 121 are angled at about 60 degrees to about 70 degrees off of normal to the longitudinal axis 104.

During processing, the lower chamber volume 139A may be filled with a processing liquid supplied from the inlet manifold 142, and the upper chamber volume 139B may be filled with a vapor coming in from the openings 121 disposed on the chamber lid 110. The liquid/vapor interface 143 may be created in the chamber body 101 by the introduction of the vapor from the openings 121. In one embodiment, the processing liquid fills up the lower chamber volume 139A and overflows from the weir 117, and the liquid/vapor interface 143 is located at substantially the same level as the upper portion of the weir 117.

During processing, a substrate (not shown) being processed in the substrate processing chamber 100 is first immersed in the processing liquid disposed in the lower chamber volume 139A, and then pulled out of the processing liquid. It is desirable that the substrate is free of the processing liquid after being pulled out of the lower chamber volume 139A. In one embodiment, the presence of a surface tension gradient on the substrate will naturally cause the liquid to flow away from regions of low surface tension, which may be referred to as the Marangoni effect, is used to remove the processing liquid from the substrate. The surface tension gradient may be created at the liquid/vapor interface 143. In one embodiment, an IPA vapor is used to create the liquid/vapor interface 143. When the substrate is being pulled out from the processing liquid in the lower chamber volume 139A, the IPA vapor condenses on the liquid meniscus extending between the substrate and the processing liquid, which facilitates a concentration of IPA in the meniscus, and results in the so-called Marangoni effect.

Figure 2:
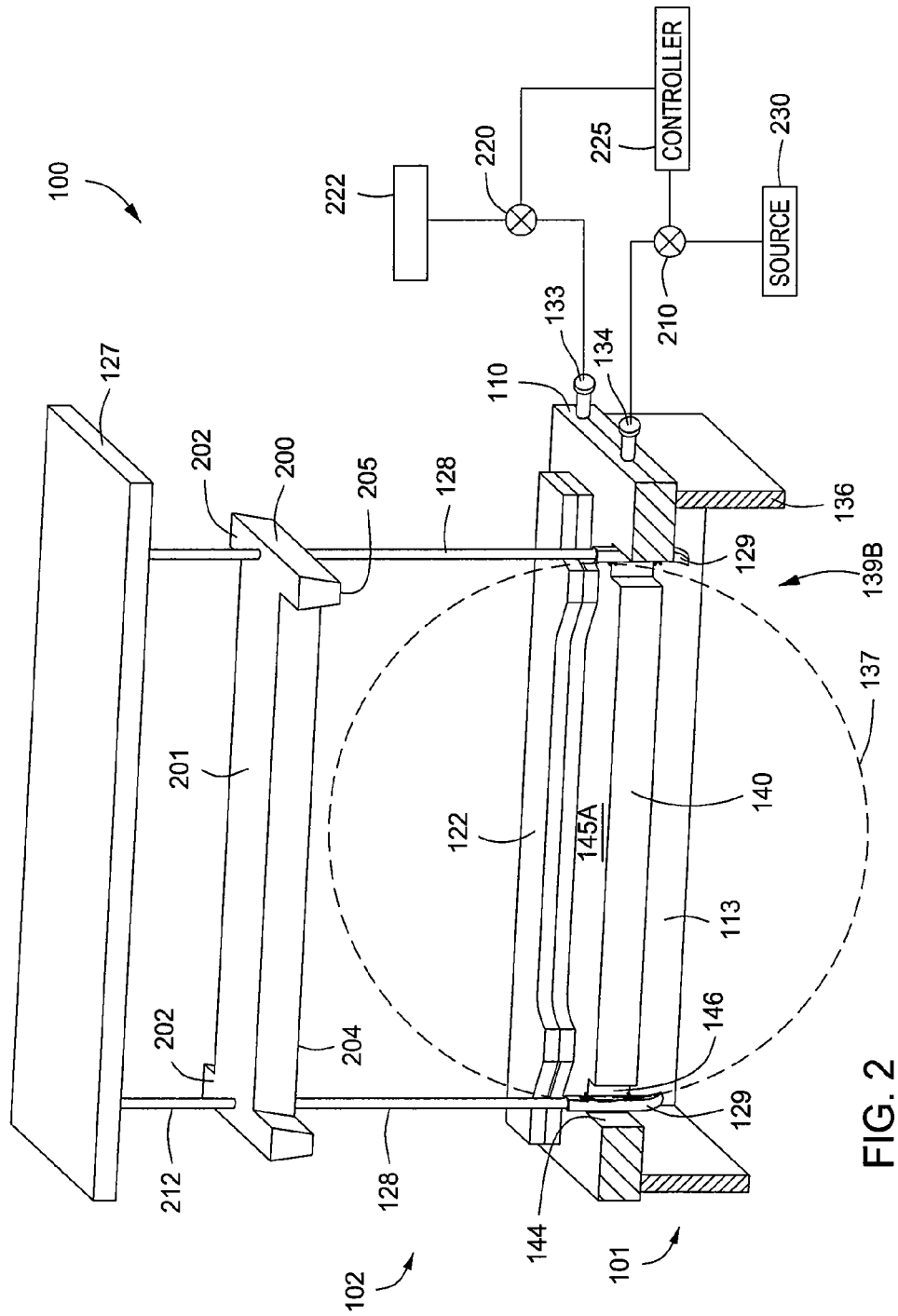
FIG. 2 is an isometric view of another embodiment of a portion of a substrate processing chamber.

FIG. 2 is an isometric view of another embodiment of a portion of a substrate processing chamber 100. The substrate transfer assembly 102 comprises a pair of rods 128 statically connected to a frame 127, which is coupled to an actuator (not shown) configured to move the substrate transfer assembly 102 relative to the chamber body 101. Each rod 128 may be made of a material, such as stainless steel, aluminum, a ceramic, or other material having sufficient strength and rigidity to support and transfer a substrate 137. The material comprising the rod 128 may include a coating or finish 212, such as coating made of a polymer, such as a Teflon® material, or other suitable process resistant material. The coating or finish 212 may be roughened or otherwise finished to enhance surface characteristics. In one embodiment, each rod 128 has a finish 212 that includes a Teflon® material that is roughened, which may increase the hydrophobicity of the rod 128.

Each of the rods 128 have an end effector 129 configured to receive and secure the substrate 137 by an edge of the substrate. Each end effector 129 may be made of a material, such as stainless steel, aluminum, or a ceramic material, and may be coated with a Teflon® material, or other suitable process resistant material. The coating may be roughened or otherwise finished to increase the hydrophobicity of the end effector 129. Each of the end effectors 129 is configured to provide lateral and radial support to the substrate 137 while the substrate transfer assembly 102 moves the substrate 137 into and out of the chamber body 101. In one embodiment shown in FIG. 1, two pairs of rod members 130A, 130B may extend inwardly from the end effector 129 to provide lateral support to the substrate 137, and a groove formed between each pair of the rod members 130A, 130B may be configured to provide radial support to the substrate 137. The top pair of rod members 130A and bottom pair of rod members 130B form an angle of about 15 degrees to about 25 degrees, for example about 20 degrees, with the center of the substrate 137 as the vertex of the angle. In one embodiment, the opening 140 on the chamber lid 110 may have enlarged ends 144 to accommodate the end effectors 129.

Referring to FIGS. 1 and 2, after cleaning, etching and/or rinsing the substrate 137 in a process liquid in the lower chamber volume 139A of the substrate processing chamber 100, the substrate is removed from the lower chamber volume 139A across the liquid/vapor interface 143, and out of the substrate processing chamber 100 by the substrate transfer assembly 102. During the removal process, the substrate surfaces may demonstrate hydrophilic properties which may cause residual liquid on the substrate surface to flow across the substrate surface, generally known as "streaking". When the substrate is moved across the liquid/vapor interface 143 at a particular speed, the Marangoni process may remove a majority of the processing liquid from the substrate surfaces. However, the residual processing liquid flows across the substrate surface and may be retained around the contact area between the end effectors 129 and the substrate 137. The residual liquid that migrates across the substrate is referred to as flashing and can extend up to 1 cm or more from the contact area between the substrate 137 and end effector 129.

In one embodiment, a purge gas may be used following the Marangoni process to remove any residual processing liquid on the substrate 137. A purge assembly 122 may be attached to an upper surface 145A of the chamber lid 110. The directed purge assembly 122 is configured to provide a gas flow to the substrate 137 as the substrate 137 is being removed from the substrate processing chamber 100. The residual fluid retained at the contact region between the end effector 129 and substrate 137 is removed upon exposure to a gas flow delivered from the directed purge assembly 122. The residual fluid may be removed because of the pushing force from the gas flow and/or the drying effect of the gas flow. A variety of gases may be used for the gas flow, for example air, and non-reactive gases, such as nitrogen ($N_2$), argon (Ar), carbon dioxide ($CO_2$), helium (He), or combinations thereof. In one embodiment, the gas used in the gas flow may be heated to increase the drying effect. An example of a purge assembly 122 and details of end effectors 129 may be found in U.S. patent application Ser. No. 11/460,049, filed Jul. 26, 2006, which was previously incorporated by reference.

In the embodiment shown in FIG. 2, the substrate transfer assembly 102 includes a lid member 200 coupled to the pair of rods 128. The lid member 200 comprises a body 201 sized to be received at least partially by the opening 140 formed in the chamber lid 110. The opening 140 is sized slightly larger than the lid member 200 and the lid member 200 may selectively contact and/or couple with the opening 140 to form a seal to prevent escape of gas or vapors that may be present or form in the chamber 100. For example, the lid member 200 is configured to form a substantially hermetic seal when the lid member 200 is lowered onto and in contact with at least a portion of the opening 140. The substantially hermetic seal prevents or minimizes escape of vapors or fumes that my be present in, or may be formed in, the upper chamber volume 139B. The lid member 200 may include apertures formed therein to couple to each of the rods 128, and may be made of a process resistant material, such as a fluoropolymer, for example polyvinylidene fluoride (PVDF). The body 201 of the lid member 200 may include extensions 202 that are sized to be received by the enlarged ends 144 of the opening 140, and may also include a lower surface 204 having a beveled edge 205, which may facilitate seating and/or sealing of the upper chamber volume 139B as the lid member 200 is lowered into the opening 140. In another embodiment (not shown), the one of the lid member 200 and the opening 140 may comprise an o-ring made of a process resistant material, such as an elastomer material, in order to facilitate enhanced sealing of the upper chamber volume 139B.

In operation, the substrate transfer assembly 102 retrieves a substrate 137 from a transfer device (not shown), and by movement of one or both of the transfer assembly 102 and the transfer device, the substrate 137 is transferred to, and supported by, the end effectors 129. A description of a suitable transfer device, and other elements of a cleaning chamber, support systems, and platform, is described in U.S. patent application Ser. No. 11/620,610 which published as United States Patent Publication No. 2008/0166208 on Jul. 10, 2008, which is incorporated by reference in its entirety. The transfer assembly 102, having the substrate disposed thereon, is lowered into the lower chamber volume 139A through the opening 140. A fluid may be provided to the lower chamber volume 139A before the substrate 137 is lowered, or the fluid may be provided during the lowering or after the lowering. The fluid may be cleaning fluids, etchants, rinse fluids, and the like as described above, and the transducer assemblies 115A, 115B, 115C may be actuated to facilitate cleaning of the substrate 137. After cleaning, the transfer assembly 102 lifts the substrate 137 from the lower chamber volume 139A through the liquid/vapor interface 143, where the transducer assemblies 115B, 115C may assist in cleaning, and the IPA vapor may assist or promote drying. As the substrate passes through the liquid/vapor interface 143 and the opening 140 adjacent the purge assembly 122, the substrate is clean and dried by action of the Marangoni effect and/or the purge assembly 122.

As mentioned above, introduction of the fluids and subsequent reactions within the lower chamber volume 139A may emit volatile or otherwise unsafe fumes and vapors. In particular, etching fluids, which include acids, such as hydrofluoric acid, and cleaning chemicals, which include SC1, APM, or AM1, may produce or emit unsafe vapors before, during, or after the process in the lower chamber volume 139A. Without sufficient means to contain these fumes within the chamber body 101, the fumes may escape the chamber body through the opening 140, which may cause a fire or explosion, or affect personnel. In order to minimize or eliminate the escape of the fumes or vapors, the lid member 200 is configured to be in sealing communication with the opening, thereby creating a substantial hermetic seal when the substrate transfer assembly 102 reaches a depth within the chamber body 101 that corresponds with the entire substrate 137 being disposed or at least partially immersed in the liquid in the lower chamber volume 139A, such as below the liquid/vapor interface 143. When this depth is reached, the cleaning/etching/rinsing solutions may be in contact and in communication with the entire substrate.

At this point in the process, any fumes or vapors from the lower chamber volume 139A will flow to the upper chamber volume 139B and into the overflow volume 113. A controller 225 may send a signal to a valve 220 coupled to a source of negative pressure 222, in order to initiate or enhance removal of the fumes or vapors from the upper chamber volume 139B. The valve 220 may include a switch to facilitate on/off cycling, or various switchable modes to control flow rate and/or the amount of negative pressure flowing through the valve. The valve 220 may also include a pressure sensor, or otherwise be coupled to or controlled at least partially by a pressure sensor. The source of negative pressure 222 is coupled to a port 133 that is in communication with the exhaust channel 118 (not shown in this view). Vapors or fumes present in the upper chamber volume 139B may be removed through the plurality of openings 119 formed between the channel and the upper chamber volume 139B. The source of negative pressure 222 may be a vacuum pump or a facility exhaust configured to apply a negative pressure of about 0.2 inches water column to about 3 inches water column. In one embodiment, the negative pressure is constant, or may be cycled on and off as needed to remove vapors from the upper chamber volume 139B. Alternatively, the negative pressure may be varied by signals from the controller to one or both of the source of negative pressure 222 and valve 220 in order to facilitate enhanced exhausting of the upper chamber volume 139B. For example, the valve 220 may be at least partially open and in communication with the source of negative pressure 222 before processing, in order to remove any fumes or vapors that may be present in the upper chamber volume 139B, and during and after processing, the valve 220 and/or the source of negative pressure 222 may be actuated to enable a higher removal rate of fumes. In one embodiment, the valve 220 is open and the source of negative pressure 222 is on and in communication with the upper chamber volume 139B at all times during processing except when IPA vapor is introduced to the chamber 100.

During and after processing of the substrate 137 in the lower chamber volume 139A, the valve 220 and source of negative pressure 222 may constantly remove any fumes or vapors from the upper chamber volume 139B. As the process in the lower chamber volume 139A is substantially complete, the transfer assembly 102 raises the substrate 137 from the lower chamber volume 139A through the liquid/vapor interface 143. IPA vapor may be provided by an IPA source 230 coupled to a valve 210, which supplies IPA vapor to an inlet 134, which is in communication with the inlet channel 120 (not shown in this view). In one embodiment, the flow rate of IPA is between about 0.02 mL/second to about 2 mL/second. During application of IPA vapor, the valve 220 may be closed and/or the source of negative pressure 222 may be deactivated to allow the IPA vapor to interact with the substrate.

Concurrently with the lifting of the substrate from the lower chamber volume 139A, the lid member 200, which is attached to the rods 128, is moved away from the opening 140. To facilitate removal of the IPA vapors and any other vapors or fumes that may be in the chamber body 101, one or both of the valve 220 and source of negative pressure 222 may be actuated to a provide a greater negative pressure, which enhances the removal of the fumes and vapors from the upper chamber volume 139B and the overflow volume 113. In one embodiment, the IPA vapor is not removed from the upper chamber volume 139B and/or the overflow volume 113 for a time period during the drying process to promote interaction of the IPA vapor with the substrate. In some embodiments, the valve 220 and/or the source of negative pressure 222 may be activated during a purge or priming process of the IPA system. This enhanced exhaust may eliminate or minimize escape of the fumes or vapors from the upper chamber volume 139B through the opening 140.

Figure 3:
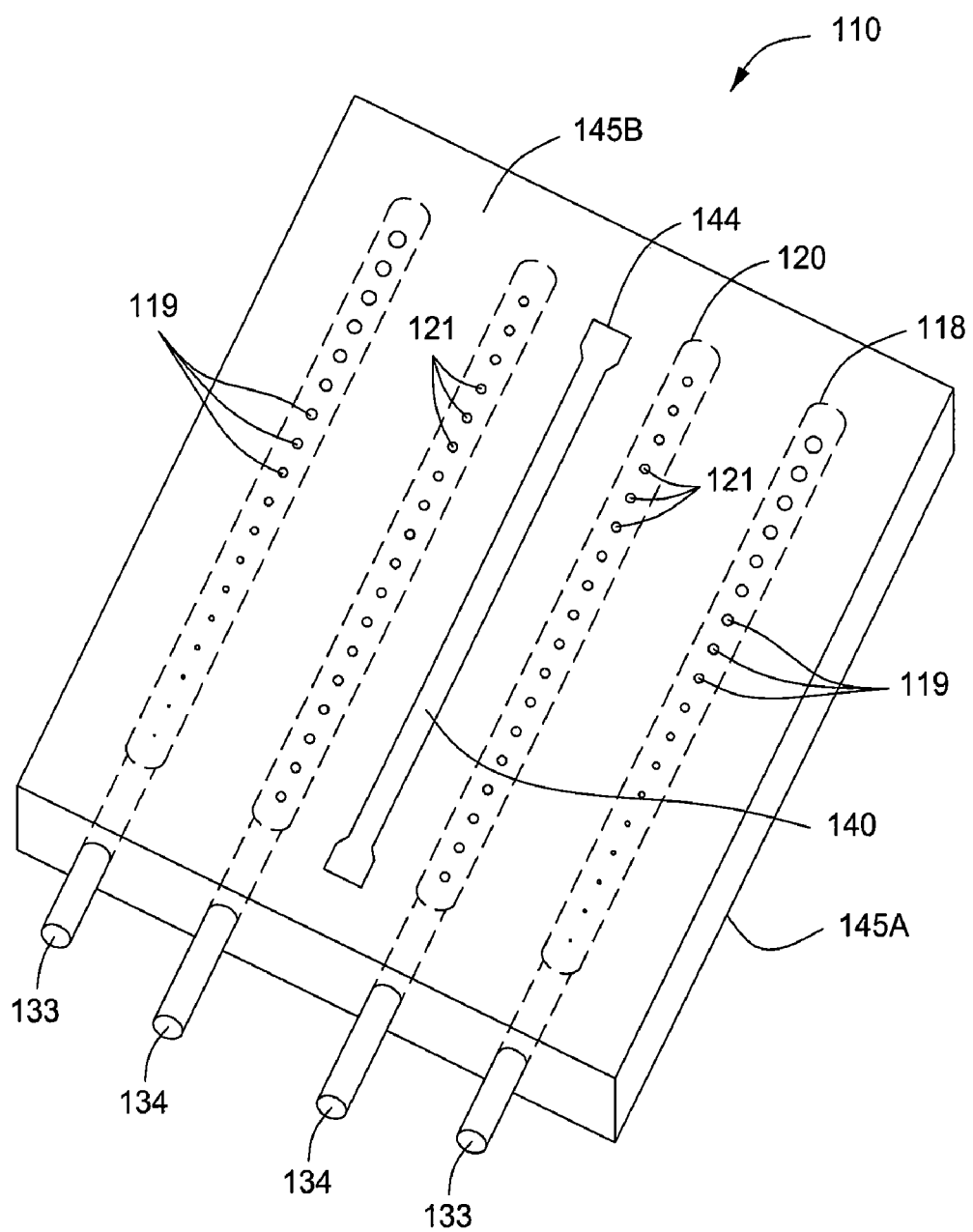
FIG. 3 is an isometric view of an underside of one embodiment of a lid assembly.

FIG. 3 is an isometric view of an underside 145B of one embodiment of the lid assembly 110 having the opening 140 formed therethrough. Also shown in phantom is the inlet channels 120 and the exhaust channels 118 disposed adjacent and substantially parallel to the opening 140. The inlet channels 120 have a plurality of openings 121 that may be adapted as nozzles to deliver one or more fluids, such as IPA vapor and other processing fluids. The inlet channels 120 are spaced apart from the opening 140 and the plurality of openings 121 are angled to direct the one or more fluids to the liquid/vapor interface 143 as described in reference to FIG. 1. In one embodiment, each of the plurality of openings 121 may include a similar diameter and pitch therebetween. Alternatively, the plurality of openings 121 may be a single opening or multiple slots that may be angled to direct fluids as described above.

The exhaust channels 118 are disposed laterally and outwards from the inlet channels 120, and have a plurality of openings 119 formed therethrough. The exhaust channels 118 and the plurality of openings 119 are proportioned to sufficiently exhaust the upper chamber volume 139B and the overflow volume 113. In one embodiment, each of the plurality of openings 119 have an expanding diameter as the openings extend away from the ports 133, such as between about 0.1 inches to about 0.50 inches, for example, between about 0.1 inches to about 0.25 inches. The plurality of openings 119 may include an expanding diameter in substantially equal increments and pitch therebetween. For example, the opening adjacent the port 133 may have a diameter of about 0.1 inches, and the opening farthest from the port 133 may have a diameter of about 0.25 inches. Any openings formed between the outermost openings may include a diameter between greater than about 0.1 inches and about less than about 0.25 inches, in substantially equal increments and pitch. The expanding diameter of the plurality of openings 119 may facilitate enhanced exhaust of the upper chamber volume 139B and overflow volume 113 by minimizing the pressure gradient across the length of the exhaust channel 118. The enhanced exhausting thus prevents or minimizes escape of vapors or fumes from the upper chamber volume 139B and overflow volume 113, and the spacing and size of the openings 119 facilitates enhanced removal of IPA vapors and other fumes from the upper chamber volume 139B before the fumes or vapors reach the opening 140.

As an alternative to the plurality of openings 119, the exhaust channels 118 may include a plurality of slots, or one continuous slot or channel formed in the lid assembly 110. Each of the plurality of slots may include a different size, or in the case of a single channel, the channel may include a gradually expanding area, which may comprise a trapezoidal shape when viewed from the bottom 145B of the lid assembly 110. For example, the channel may include a substantially isosceles trapezoidal shape when viewed from the bottom 145B of the lid assembly 110, and include an area that expands away from the outlet port 133.

Figure 4:
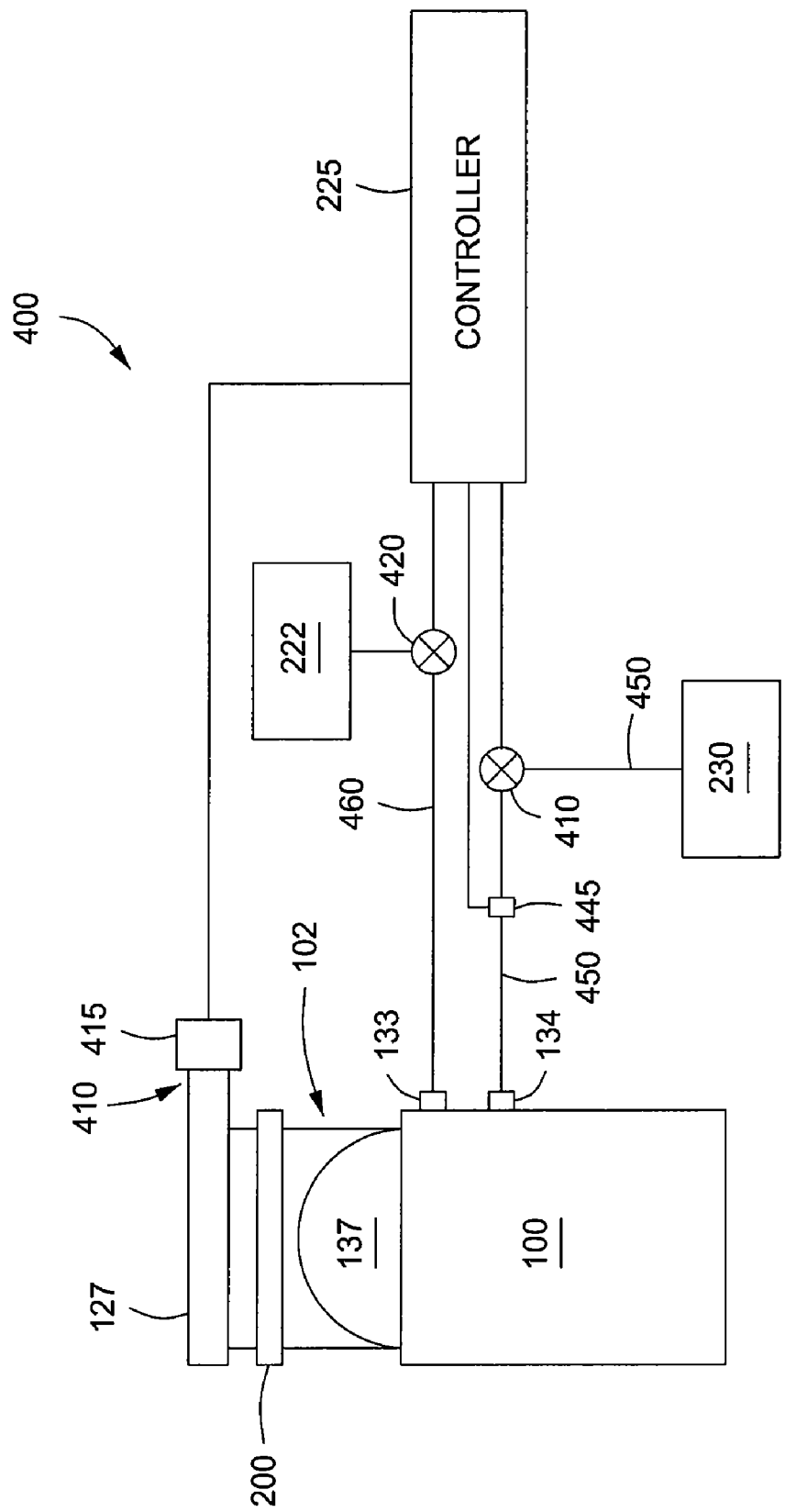
FIG. 4 is a schematic view of one embodiment of a vapor delivery and removal system.

FIG. 4 is a schematic view of one embodiment of a vapor delivery and removal system 400 coupled to a cleaning chamber 100. The vapor delivery and removal system 400 includes an IPA source 230 coupled to the cleaning chamber 100 by an inlet port 134, with a switchable valve 410 therebetween, and an exhaust means 222 coupled to the cleaning chamber 100 by an exhaust port 133, with a switchable valve 420 therebetween. Suitable plumbing, such as conduits 450, 460 and associated fittings, facilitate flow of vapors to and from the cleaning chamber 100. In one embodiment, the conduit 450 includes a heating means 445, which may be a vaporizer configured to convert the IPA from the IPA source 230 to a vapor. The controller 225 is coupled to the switchable valves 410, 420, and the heating means 445 to supply control signals to the respective devices.

The cleaning chamber 100 includes a substrate transfer assembly 102 having the lid member coupled thereto, which is configured to selectively seal the cleaning chamber during at least a portion of the cleaning process. The frame 127 of the substrate transfer assembly 102 is coupled to a translation device 410, which may be a robot configured to lift, lower, and move the substrate transfer assembly 102 laterally. The translation device 410 may include an actuator 415 that may be a motor or other mechanical device, which may be actuated hydraulically, pneumatically, or electrically. One or both of the translation device 410 and actuator 415 is coupled to the controller 225 to supply control signals to facilitate vertical and/or horizontal movement of the substrate transfer assembly 102.

In operation, as the substrate transfer assembly 102 is lowered into the cleaning chamber 100 to a suitable depth as described above, the lid member 200 is in sealing communication with the chamber 100, substantially sealing the environment within the chamber from the atmosphere outside the chamber. Chemicals are supplied to the interior of the chamber 100 to facilitate etching, cleaning, and rinsing of the substrate 137 as described above. At or before the introduction of the substrate 137 to the chamber 100, one or both of the switchable valve 420 and source of negative pressure may be actuated to prevent or minimize escape of vapors or fumes from the chamber 100.

When the process in the lower chamber volume 139A is nearing completion, the substrate transfer assembly 102 lifts the substrate through the liquid/vapor interface 143. IPA vapor may be supplied to the upper chamber volume 139B and the switchable valve 420 is actuated to a closed position, and/or source of negative pressure 222 is turned off to facilitate interaction of IPA vapors with the substrate 137. Alternatively, the switchable valve 420 and/or the source of negative pressure 222 may be actuated to facilitate removal of at least a portion of the IPA vapor and any other fumes that may be present in the upper chamber volume 139B or overflow volume 113. The substrate transfer assembly 102 may continue raising the substrate 137 through the opening and the purge gas assembly 122 (FIG. 1) may provide gases, such as air, and non-reactive gases, such as nitrogen ($N_2$), argon (Ar), carbon dioxide ($CO_2$), helium (He), or combinations thereof, to assist in drying of the substrate 137 as the substrate passes adjacent the purge gas assembly 122. The substrate transfer assembly 102 may then place the substrate 137 into a transfer device and another substrate may be received by the substrate transfer assembly 102 for introduction into the chamber 100.

While the foregoing is directed to embodiments of the present invention, other and further embodiments of the invention may be devised without departing from the basic scope thereof, and the scope thereof is determined by the claims that follow.

The invention claimed is:

1. A substrate processing apparatus, comprising:
   a chamber having a chamber lid including a substrate transfer assembly opening and an interior volume sized to receive a single substrate, wherein the interior volume further comprises:
   a lower volume configured to maintain a liquid at a predetermined depth;
   an upper volume configured to at least partially confine a gaseous atmosphere above the liquid;
   a transducer assembly disposed in the lower volume;
   a plurality of transducer assemblies disposed near an interface between the upper and lower volume;
   an exhaust system coupled to the chamber lid configured to remove vapors from the upper volume, wherein the exhaust system includes a switchable valve to vary the application of negative pressure within the upper volume, and wherein the exhaust system includes a plurality of exhaust opening that are formed in the chamber lid and in communication with a source of negative pressure; and an outlet port coupled to the exhaust system, wherein at least a portion of the plurality of exhaust openings have different diameters and the exhaust openings are arranged relative to the outlet port in a gradually-increasing, smallest-diameter-to-largest-diameter pattern such that the exhaust opening or openings with the smallest diameter are arranged closest to the outlet port relative to other exhaust openings and the exhaust opening or openings with the largest diameter are arranged furthest from the outlet port relative to other exhaust openings.

2. The apparatus of claim 1, further comprising:

a substrate transfer assembly having a body disposed thereon, the body sized to selectively couple with the substrate transfer assembly opening in the chamber lid.

3. The apparatus of claim 2, wherein the substrate transfer assembly opening is sealed by the body when the substrate is at least partially within the interior volume.

4. The apparatus of claim 1, wherein the chamber lid includes at least two inlet channels and at least two exhaust channels.

5. The apparatus of claim 4, wherein each exhaust channel is disposed outward of and substantially parallel to each inlet channel.

6. A substrate processing apparatus, comprising:

a chamber having an interior volume sized to receive a single substrate, wherein the interior volume further comprises:

a lower volume configured to maintain a liquid at a predetermined depth;

an upper volume configured to at least partially confine a gaseous atmosphere above the liquid;

a transducer assembly disposed in the lower volume;

a plurality of transducer assemblies disposed near an interface between the upper and lower volume; and a chamber lid disposed on an upper portion of the chamber, the chamber lid comprising:

a body having an upper surface and an underside and an opening formed between the upper surface and the underside, the opening sized to receive a single substrate;

a plurality of inlet channels and a plurality of exhaust channels formed in the body and disposed outward of and adjacent to the opening, each of the exhaust channels being in selective communication with a source of negative pressure by a valve that varies the application of negative pressure in the upper volume, wherein each of the plurality of inlet channels and the plurality of exhaust channels include one or more apertures formed in the underside and in fluid communication with the inlet channels and the exhaust channels; and an outlet port coupled to each of the plurality of exhaust channels, wherein each of the one or more apertures formed in the underside and in fluid communication with the exhaust channels include at least two apertures, wherein at least a portion of each of the at least two apertures have different diameters and each of the at least two apertures are arranged in a gradually-increasing, smallest-diameter-to-largest-diameter pattern relative to the outlet port with which the channel in which they are formed communicates such that the aperture or apertures with the smallest diameter are arranged closest to that outlet port and the aperture or apertures with the largest diameter are arranged furthest from that outlet port.

7. The apparatus of claim 6, wherein the plurality of inlet channels are substantially parallel to the plurality of outlet channels.

8. The apparatus of claim 6, wherein the plurality of inlet channels and the plurality of outlet channels are substantially parallel to the opening formed through the body.

9. The apparatus of claim 6, wherein each of the one or more apertures in fluid communication with the plurality of inlet channels are angled at about 60 degrees to about 70 degrees off of normal to a longitudinal axis of the chamber.

* * * * *